(12) United States Patent
Medioni

(10) Patent No.: US 10,339,443 B1
(45) Date of Patent: Jul. 2, 2019

(54) SYSTEMS AND METHODS FOR PROCESSING CONVOLUTIONAL NEURAL NETWORK OPERATIONS USING TEXTURES

(71) Applicant: GOPRO, INC., San Mateo, CA (US)

(72) Inventor: Tom Medioni, Paris (FR)

(73) Assignee: GoPro, Inc., San Mateo, CA (US)

( * ) Notice: Subject to any disclaimer, the term of this patent is extended or adjusted under 35 U.S.C. 154(b) by 150 days.

(21) Appl. No.: 15/441,963

(22) Filed: Feb. 24, 2017

(51) Int. Cl.
| | |
|---|---|
| *G06N 3/06* | (2006.01) |
| *G06N 3/08* | (2006.01) |
| *G06T 7/40* | (2017.01) |
| *G06T 15/04* | (2011.01) |
| *G06T 15/80* | (2011.01) |
| *H03H 17/02* | (2006.01) |

(52) U.S. Cl.
CPC ............... *G06N 3/06* (2013.01); *G06N 3/08* (2013.01); *G06T 7/40* (2013.01); *G06T 15/04* (2013.01); *G06T 15/80* (2013.01); *H03H 17/0202* (2013.01); *G06T 2207/20084* (2013.01)

(58) Field of Classification Search
CPC ... G06N 3/06; G06N 3/08; G06T 7/40; G06T 15/04; G06T 15/80; H03H 17/0202
See application file for complete search history.

(56) References Cited

U.S. PATENT DOCUMENTS

| | | | |
|---|---|---|---|
| 6,633,685 B1 | 10/2003 | Kusama |
| 7,222,356 B1 | 5/2007 | Yonezawa |
| 7,483,618 B1 | 1/2009 | Edwards |
| 7,512,886 B1 | 3/2009 | Herberger |
| 7,885,426 B2 | 2/2011 | Golovchinsky |
| 7,970,240 B1 | 6/2011 | Chao |
| 8,180,161 B2 | 5/2012 | Haseyama |
| 8,396,878 B2 | 3/2013 | Acharya |
| 8,446,433 B1 | 5/2013 | Mallet |
| 8,606,073 B2 | 12/2013 | Woodman |
| 8,611,422 B1 | 12/2013 | Yagnik |

(Continued)

FOREIGN PATENT DOCUMENTS

| | | |
|---|---|---|
| JP | H09181966 A | 7/1997 |
| JP | 2005252459 A | 9/2005 |

(Continued)

OTHER PUBLICATIONS

PCT International Search Report and Written Opinion for PCT/US2015/023680, dated Oct. 6, 2015, 13 pages.

(Continued)

*Primary Examiner* — Mia M Thomas
(74) *Attorney, Agent, or Firm* — Esplin & Associates, PC

(57) ABSTRACT

Convolutional neural network information may define a convolutional neural network including layers. The layers may define operations on an input to the convolutional neural network. The layers in the convolutional neural network information may be formatted as shaders. Input information defining the input to the convolutional neural network may be accessed. The input information may be formatted as an array of textures. The shaders may be applied to the textures to effectuate processing the input to the convolutional neural network through the layers of the convolutional neural network. One or more results may be obtained from applying the shaders to the array of textures.

18 Claims, 15 Drawing Sheets

(56) References Cited

U.S. PATENT DOCUMENTS

| | | | |
|---|---|---|---|
| 8,612,463 B2 | 12/2013 | Brdiczka | |
| 8,718,447 B2 | 5/2014 | Yang | |
| 8,763,023 B1 | 6/2014 | Goetz | |
| 8,774,560 B2 | 7/2014 | Sugaya | |
| 8,971,623 B2 | 3/2015 | Gatt | |
| 8,990,328 B1 | 3/2015 | Grigsby | |
| 9,041,727 B2 | 5/2015 | Ubillos | |
| 9,077,956 B1 | 7/2015 | Morgan | |
| 9,142,257 B2 | 9/2015 | Woodman | |
| 9,253,533 B1 | 2/2016 | Morgan | |
| 9,342,376 B2 | 5/2016 | Jain | |
| 9,373,059 B1 * | 6/2016 | Heifets | G06F 19/16 |
| 9,396,385 B2 | 7/2016 | Bentley | |
| 9,418,283 B1 | 8/2016 | Natarajan | |
| 9,501,724 B1 * | 11/2016 | Yang | G06K 9/6828 |
| 9,836,853 B1 * | 12/2017 | Medioni | G06N 3/0445 |
| 9,916,863 B1 * | 3/2018 | Medioni | G11B 27/031 |
| 2002/0165721 A1 | 11/2002 | Chang | |
| 2004/0001706 A1 | 1/2004 | Jung | |
| 2004/0128317 A1 | 7/2004 | Sull | |
| 2005/0025454 A1 | 2/2005 | Nakamura | |
| 2005/0108031 A1 | 5/2005 | Grosvenor | |
| 2005/0198018 A1 | 9/2005 | Shibata | |
| 2006/0080286 A1 | 4/2006 | Svendsen | |
| 2006/0115108 A1 | 6/2006 | Rodriguez | |
| 2007/0204310 A1 | 8/2007 | Hua | |
| 2007/0230461 A1 | 10/2007 | Singh | |
| 2008/0044155 A1 | 2/2008 | Kuspa | |
| 2008/0123976 A1 | 5/2008 | Coombs | |
| 2008/0152297 A1 | 6/2008 | Ubillos | |
| 2008/0163283 A1 | 7/2008 | Tan | |
| 2008/0177706 A1 | 7/2008 | Yuen | |
| 2008/0183843 A1 | 7/2008 | Gavin | |
| 2008/0253735 A1 | 10/2008 | Kuspa | |
| 2008/0313541 A1 | 12/2008 | Shafton | |
| 2009/0019995 A1 | 1/2009 | Miyajima | |
| 2009/0125559 A1 | 5/2009 | Yoshino | |
| 2009/0213270 A1 | 8/2009 | Ismert | |
| 2009/0232349 A1 * | 9/2009 | Moses | G06F 9/5072 382/100 |
| 2009/0252474 A1 | 10/2009 | Nashida | |
| 2010/0046842 A1 | 2/2010 | Conwell | |
| 2010/0086216 A1 | 4/2010 | Lee | |
| 2010/0104261 A1 | 4/2010 | Liu | |
| 2010/0183280 A1 | 7/2010 | Beauregard | |
| 2010/0199182 A1 | 8/2010 | Lanza | |
| 2010/0231730 A1 | 9/2010 | Ichikawa | |
| 2010/0245626 A1 | 9/2010 | Woycechowsky | |
| 2010/0251295 A1 | 9/2010 | Amento | |
| 2010/0274714 A1 | 10/2010 | Sims | |
| 2010/0278504 A1 | 11/2010 | Lyons | |
| 2010/0278509 A1 | 11/2010 | Nagano | |
| 2010/0281375 A1 | 11/2010 | Pendergast | |
| 2010/0281386 A1 | 11/2010 | Lyons | |
| 2010/0318660 A1 | 12/2010 | Balsubramanian | |
| 2011/0029471 A1 * | 2/2011 | Chakradhar | G06N 3/063 706/25 |
| 2011/0075990 A1 | 3/2011 | Eyer | |
| 2011/0093798 A1 | 4/2011 | Shahraray | |
| 2011/0103700 A1 | 5/2011 | Haseyama | |
| 2011/0137156 A1 | 6/2011 | Razzaque | |
| 2011/0170086 A1 | 7/2011 | Oouchida | |
| 2011/0206351 A1 | 8/2011 | Givoly | |
| 2011/0242098 A1 | 10/2011 | Tamaru | |
| 2011/0293250 A1 | 12/2011 | Deever | |
| 2012/0014673 A1 | 1/2012 | O'Dwyer | |
| 2012/0027381 A1 | 2/2012 | Kataoka | |
| 2012/0030029 A1 | 2/2012 | Flinn | |
| 2012/0057852 A1 | 3/2012 | Devleeschouwer | |
| 2012/0123780 A1 | 5/2012 | Gao | |
| 2012/0141019 A1 | 6/2012 | Zhang | |
| 2012/0210205 A1 | 8/2012 | Sherwood | |
| 2012/0246114 A1 | 9/2012 | Edmiston | |
| 2012/0283574 A1 | 11/2012 | Park | |
| 2012/0311448 A1 | 12/2012 | Achour | |
| 2013/0136193 A1 | 5/2013 | Hwang | |
| 2013/0151970 A1 | 6/2013 | Achour | |
| 2013/0166303 A1 | 6/2013 | Chang | |
| 2013/0182166 A1 | 7/2013 | Shimokawa | |
| 2013/0195429 A1 | 8/2013 | Fay | |
| 2013/0197967 A1 | 8/2013 | Pinto | |
| 2013/0208942 A1 | 8/2013 | Davis | |
| 2013/0235071 A1 | 9/2013 | Ubillos | |
| 2013/0239051 A1 | 9/2013 | Albouze | |
| 2013/0259390 A1 | 10/2013 | Dunlop | |
| 2013/0259399 A1 | 10/2013 | Ho | |
| 2013/0282747 A1 | 10/2013 | Cheng | |
| 2013/0283301 A1 | 10/2013 | Avedissian | |
| 2013/0287214 A1 | 10/2013 | Resch | |
| 2013/0300939 A1 | 11/2013 | Chou | |
| 2013/0318443 A1 | 11/2013 | Bachman | |
| 2013/0330019 A1 | 12/2013 | Kim | |
| 2013/0343727 A1 | 12/2013 | Rav-Acha | |
| 2014/0072285 A1 | 3/2014 | Shynar | |
| 2014/0093164 A1 | 4/2014 | Noorkami | |
| 2014/0096002 A1 | 4/2014 | Dey | |
| 2014/0105573 A1 | 4/2014 | Hanckmann | |
| 2014/0149865 A1 | 5/2014 | Tanaka | |
| 2014/0152762 A1 | 6/2014 | Ukil | |
| 2014/0161351 A1 | 6/2014 | Yagnik | |
| 2014/0165119 A1 | 6/2014 | Liu | |
| 2014/0169766 A1 | 6/2014 | Yu | |
| 2014/0176547 A1 * | 6/2014 | Duluk, Jr. | G06T 15/005 345/426 |
| 2014/0212107 A1 | 7/2014 | Saint-Jean | |
| 2014/0219634 A1 | 8/2014 | McIntosh | |
| 2014/0226953 A1 | 8/2014 | Hou | |
| 2014/0232818 A1 | 8/2014 | Carr | |
| 2014/0245336 A1 | 8/2014 | Lewis, II | |
| 2014/0282661 A1 | 9/2014 | Martin | |
| 2014/0300644 A1 | 10/2014 | Gillard | |
| 2014/0328570 A1 | 11/2014 | Cheng | |
| 2014/0334796 A1 | 11/2014 | Galant | |
| 2014/0341528 A1 | 11/2014 | Mahate | |
| 2014/0366052 A1 | 12/2014 | Ives | |
| 2015/0015680 A1 | 1/2015 | Wang | |
| 2015/0022355 A1 | 1/2015 | Pham | |
| 2015/0029089 A1 | 1/2015 | Kim | |
| 2015/0039646 A1 | 2/2015 | Sharifi | |
| 2015/0067811 A1 | 3/2015 | Agnew | |
| 2015/0071547 A1 | 3/2015 | Keating | |
| 2015/0113009 A1 | 4/2015 | Zhou | |
| 2015/0130818 A1 * | 5/2015 | Peng | G06T 15/04 345/501 |
| 2015/0156247 A1 | 6/2015 | Hensel | |
| 2015/0186073 A1 | 7/2015 | Pacurariu | |
| 2015/0287435 A1 | 10/2015 | Land | |
| 2015/0294219 A1 * | 10/2015 | Krizhevsky | G06N 3/084 706/25 |
| 2015/0318020 A1 | 11/2015 | Pribula | |
| 2015/0373281 A1 | 12/2015 | White | |
| 2015/0375117 A1 | 12/2015 | Thompson | |
| 2015/0382083 A1 | 12/2015 | Chen | |
| 2016/0005440 A1 | 1/2016 | Gower | |
| 2016/0026874 A1 | 1/2016 | Hodulik | |
| 2016/0027470 A1 | 1/2016 | Newman | |
| 2016/0027475 A1 | 1/2016 | Hodulik | |
| 2016/0029105 A1 | 1/2016 | Newman | |
| 2016/0045827 A1 * | 2/2016 | Moya | A63F 13/60 345/582 |
| 2016/0055885 A1 | 2/2016 | Hodulik | |
| 2016/0094601 A1 | 3/2016 | Besehanic | |
| 2016/0103830 A1 | 4/2016 | Cheong | |
| 2016/0189752 A1 | 6/2016 | Galant | |
| 2016/0225405 A1 | 8/2016 | Matias | |
| 2016/0225410 A1 | 8/2016 | Lee | |
| 2016/0234345 A1 | 8/2016 | Roberts | |
| 2016/0260000 A1 | 9/2016 | Yamakawa | |
| 2016/0286235 A1 | 9/2016 | Yamamoto | |
| 2016/0292881 A1 | 10/2016 | Bose | |
| 2016/0358603 A1 | 12/2016 | Azam | |
| 2016/0366330 A1 | 12/2016 | Boliek | |
| 2017/0083762 A1 * | 3/2017 | Segalovitz | G06K 9/00442 |
| 2017/0200302 A1 * | 7/2017 | Haveman | G06T 11/60 |

(56) References Cited

U.S. PATENT DOCUMENTS

| | | | |
|---|---|---|---|
| 2017/0304732 A1* | 10/2017 | Velic | G06K 9/00201 |
| 2018/0005074 A1* | 1/2018 | Shacham | G06K 9/46 |
| 2018/0018556 A1* | 1/2018 | Young | G06N 3/04 |
| 2018/0032846 A1* | 2/2018 | Yang | G06K 9/00711 |
| 2018/0114114 A1* | 4/2018 | Molchanov | G06N 3/082 |
| 2018/0220589 A1* | 8/2018 | Burden | A01G 3/02 |
| 2018/0293737 A1* | 10/2018 | Sun | G06T 7/207 |
| 2018/0322606 A1* | 11/2018 | Das | G06F 9/46 |
| 2018/0365532 A1* | 12/2018 | Molchanov | G06K 9/46 |
| 2019/0034734 A1* | 1/2019 | Yen | G06K 9/00718 |
| 2019/0035113 A1* | 1/2019 | Salvi | G06N 3/08 |
| 2019/0057509 A1* | 2/2019 | Lv | G06T 7/254 |

FOREIGN PATENT DOCUMENTS

| | | |
|---|---|---|
| JP | 2006053694 | 2/2006 |
| JP | 2006053694 A | 2/2006 |
| JP | 2008059121 A | 3/2008 |
| JP | 2009053748 A | 3/2009 |
| JP | 2011188004 | 9/2011 |
| JP | 2011188004 A | 9/2011 |
| WO | 2006001361 A1 | 1/2006 |
| WO | 2009040538 | 4/2009 |
| WO | 2012057623 | 5/2012 |
| WO | 2012057623 A1 | 5/2012 |
| WO | 2012086120 A1 | 6/2012 |

OTHER PUBLICATIONS

Ernoult, Emeric, "How to Triple Your YouTube Video Views with Facebook", SocialMediaExaminer.com, Nov. 26, 2012, 16 pages.

PCT International Preliminary Report on Patentability for PCT/US2015/023680, dated Oct. 4, 2016, 10 pages.

PCT International Search Report for PCT/US15/23680 dated Aug. 3, 2015, 4 pages.

PCT International Search Report for PCT/US15/41624 dated Nov. 4, 2015, 5 pages.

PCT International Written Opinion for PCT/US2015/041624, dated Dec. 17, 2015, 7 Pages.

PCT International Search Report and Written Opinion for PCT/US15/12086 dated Mar. 17, 2016, 20 pages.

Schroff et al., "FaceNet: A Unified Embedding for Face Recognition and Clustering," IEEE Conference on Computer Vision and Pattern Recognition (CVPR), 2016, 10 pgs.

Parkhi et al., "Deep Face Recognition," Proceedings of the British Machine Vision, 2015, 12 pgs.

Iandola et al., "SqueezeNet: AlexNet-level accuracy with 50x fewer parameters and <0.5MB model size," arXiv:1602.07360, 2016, 9 pgs.

Ioffe et al., "Batch Normalization: Accelerating Deep Network Training by Reducing Internal Covariate Shift," arXiv:1502.03167, 2015, 11 pgs.

He et al., "Deep Residual Learning for Image Recognition," arXiv:1512.03385, 2015, 12 pgs.

Han et al., Deep Compression: Compressing Deep Neural Networks with Pruning, Trained Quantization and Huffman Coding, International Conference on Learning Representations 2016, 14 pgs.

Iandola et al., "SqueezeNet: AlexNet-level accuracy with 50x fewer parameters and <0.5MB model size", arXiv:1602.07360v3 [cs.CV] Apr. 6, 2016 (9 pgs.).

Yang et al., "Unsupervised Extraction of Video Highlights Via Robust Recurrent Auto-encoders" arXiv:1510.01442v1 [cs.CV] Oct. 6, 2015 (9 pgs).

Tran et al., "Learning Spatiotemporal Features with 3D Convolutional Networks", arXiv:1412.0767 [cs.CV] Dec. 2, 2014 (9 pgs).

FFmpeg, "Demuxing," Doxygen, Dec. 5, 2014, 15 Pages., [online] [retrieved on Jul. 13, 2015] Retrieved from the Internet <URL:https://www.ffmpeg.org/doxygen/2.3/group_lavf_encoding.html>.

FFmpeg, "Muxing," Doxygen, Jul. 20, 2014, 9 Pages, [online] [retrieved on Jul. 13, 2015] Retrieved from the internet <URL: https://www.ffmpeg.org/doxyg en/2. 3/structA VP a ck et. html>.

FFmpeg, "AVPacket Struct Reference," Doxygen, Jul. 20, 2014, 24 Pages, [online] [retrieved on Jul. 13, 2015] Retrieved from the internet <URL:https://www.ffmpeg.org/doxygen/2.5/group_lavf_decoding.html>.

Nicole Lee, Twitter's Periscope is the best livestreaming video app yet; Mar. 26, 2015 URL:http://www.engadget.com/2015/03/26/periscope/ [Retrieved Aug. 25, 2015] 11 pages.

Japanese Office Action for JP Application No. 2013-140131, dated Aug. 5, 2014, 6 pages.

Office Action for U.S. Appl. No. 13/831,124, dated Mar. 19, 2015, 14 pages.

PSonar URL: http://www.psonar.com/about retrieved on Aug. 24, 2016, 3 pages.

* cited by examiner $$O_{x,y,z} = \sigma \left( \sum_{0 \leq i < W} \sum_{0 \leq j < H} \sum_{0 \leq k < D} I_{i+x, j+y, k} \times \alpha_{i,j,k,z} + \beta_z \right)$$

FIG. 3A

$$\alpha'_k = \frac{1}{W \times H} \sum_{0 \leq i < W} \sum_{0 \leq j < H} |\alpha_{i,j}|$$

FIG. 3B

$$I \star \alpha \simeq (I_b \star \alpha_b) \times I' \alpha'_k$$

FIG. 3C

```
// conv.metal include <metal_stdlib>
using namespace metal;

constant float conv_biases[] = {
0.0, 0.0, 0.0, 0.0, };

constant float conv_weights[] = {
0, -0.50, 0.500, 0, -0.50, -2.00, 1.000, -0.50, 0.500, 1.000, 0, 0.500, 0, -0.50, 0.500, 0,
0, 0, 0, 0, 0, 0, 0, 0, 0, 0, 0, 0, 0, 0, 0, 0,
0, 0, 0, 0, 0, 0, 0, 0, 0, 0, 0, 0, 0, 0, 0, 0,
0, 0, 0, 0, 0, 0, 0, 0, 0, 0, 0, 0, 0, 0, 0, 0,
0, 0, 0, 0, 0, 0, 0, 0, 0, 0, 0, 0, 0, 0, 0, 0,
0, -0.50, 0.500, 0, -0.50, -2.00, 1.000, -0.50, 0.500, 1.000, 0, 0.500, 0, -0.50, 0.500, 0,
0, 0, 0, 0, 0, 0, 0, 0, 0, 0, 0, 0, 0, 0, 0, 0,
0, 0, 0, 0, 0, 0, 0, 0, 0, 0, 0, 0, 0, 0, 0, 0,
0, 0, 0, 0, 0, 0, 0, 0, 0, 0, 0, 0, 0, 0, 0, 0,
0, 0, 0, 0, 0, 0, 0, 0, 0, 0, 0, 0, 0, 0, 0, 0,
0, -0.50, 0.500, 0, -0.50, -2.00, 1.000, -0.50, 0.500, 1.000, 0, 0.500, 0, -0.50, 0.500, 0,
0, 0, 0, 0, 0, 0, 0, 0, 0, 0, 0, 0, 0, 0, 0, 0,
0, 0, 0, 0, 0, 0, 0, 0, 0, 0, 0, 0, 0, 0, 0, 0,
0, 0, 0, 0, 0, 0, 0, 0, 0, 0, 0, 0, 0, 0, 0, 0,
0, 0, 0, 0, 0, 0, 0, 0, 0, 0, 0, 0, 0, 0, 0, 0,
1.000, 0.500, 0.500, 0, 0.500, 0.250, 0.250, 0, 0.500, 0.250, 0.250, 0, 0, 0, 0, 0,
};

kernel void conv_GENERATED(texture2d_array<float, access::read> inputTexture [[ texture(0) ]],
        texture2d_array<float, access::write> outputTexture [[ texture(1) ]],
        uint3 gid [[ thread_position_in_grid ]]) { float4 bias = conv_biases[gid.z];

float4 result00x = float4(0);
    float4 result01x = float4(0);
    float4 result02x = float4(0);
    float4 result03x = float4(0);
    float4 result00y = float4(0);
    float4 result01y = float4(0);
    float4 result02y = float4(0);
    float4 result03y = float4(0);
    float4 result00z = float4(0);
    float4 result01z = float4(0);
    float4 result02z = float4(0);
    float4 result03z = float4(0);
    float4 result00w = float4(0);
    float4 result01w = float4(0);
    float4 result02w = float4(0);
    float4 result03w = float4(0);
```

FIG. 4A

```
for (int k = 0; k < 1; k++) {
    float4 x00 = inputTexture.read(uint2(2 * gid.x + -1, 2 * gid.y + -1, k);
    float4 x01 = inputTexture.read(uint2(2 * gid.x + -1, 2 * gid.y + 0, k);
    float4 x02 = inputTexture.read(uint2(2 * gid.x + -1, 2 * gid.y + 1, k);
    float4 x03 = inputTexture.read(uint2(2 * gid.x + -1, 2 * gid.y + 2, k);
    float4 x10 = inputTexture.read(uint2(2 * gid.x + 0, 2 * gid.y + -1, k);
    float4 x11 = inputTexture.read(uint2(2 * gid.x + 0, 2 * gid.y + 0, k);
    float4 x12 = inputTexture.read(uint2(2 * gid.x + 0, 2 * gid.y + 1, k);
    float4 x13 = inputTexture.read(uint2(2 * gid.x + 0, 2 * gid.y + 2, k);
    float4 x20 = inputTexture.read(uint2(2 * gid.x + 1, 2 * gid.y + -1, k);
    float4 x21 = inputTexture.read(uint2(2 * gid.x + 1, 2 * gid.y + 0, k);
    float4 x22 = inputTexture.read(uint2(2 * gid.x + 1, 2 * gid.y + 1, k);
    float4 x23 = inputTexture.read(uint2(2 * gid.x + 1, 2 * gid.y + 2, k);
    float4 x30 = inputTexture.read(uint2(2 * gid.x + 2, 2 * gid.y + -1, k);
    float4 x31 = inputTexture.read(uint2(2 * gid.x + 2, 2 * gid.y + 0, k);
    float4 x32 = inputTexture.read(uint2(2 * gid.x + 2, 2 * gid.y + 1, k);
    float4 x33 = inputTexture.read(uint2(2 * gid.x + 2, 2 * gid.y + 2, k);

float4 g00x = float4(conv_weights[64 * k + 192 * gid.z + 0], conv_weights[64 * k + 192 * gid.z + 64],
        conv_weights[64 * k + 192 * gid.z + 128], conv_weights[64 * k + 192 * gid.z + 192]);
    float4 g01x = float4(conv_weights[64 * k + 192 * gid.z + 1], conv_weights[64 * k + 192 * gid.z + 65],
        conv_weights[64 * k + 192 * gid.z + 129], conv_weights[64 * k + 192 * gid.z + 193]);
    float4 g02x = float4(conv_weights[64 * k + 192 * gid.z + 2], conv_weights[64 * k + 192 * gid.z + 66],
        conv_weights[64 * k + 192 * gid.z + 130], conv_weights[64 * k + 192 * gid.z + 194]);
    float4 g03x = float4(conv_weights[64 * k + 192 * gid.z + 3], conv_weights[64 * k + 192 * gid.z + 67],
        conv_weights[64 * k + 192 * gid.z + 131], conv_weights[64 * k + 192 * gid.z + 195]);
    float4 g10x = float4(conv_weights[64 * k + 192 * gid.z + 4], conv_weights[64 * k + 192 * gid.z + 68],
        conv_weights[64 * k + 192 * gid.z + 132], conv_weights[64 * k + 192 * gid.z + 196]);
    float4 g11x = float4(conv_weights[64 * k + 192 * gid.z + 5], conv_weights[64 * k + 192 * gid.z + 69],
        conv_weights[64 * k + 192 * gid.z + 133], conv_weights[64 * k + 192 * gid.z + 197]);
    float4 g12x = float4(conv_weights[64 * k + 192 * gid.z + 6], conv_weights[64 * k + 192 * gid.z + 70],
        conv_weights[64 * k + 192 * gid.z + 134], conv_weights[64 * k + 192 * gid.z + 198]);
    float4 g13x = float4(conv_weights[64 * k + 192 * gid.z + 7], conv_weights[64 * k + 192 * gid.z + 71],
        conv_weights[64 * k + 192 * gid.z + 135], conv_weights[64 * k + 192 * gid.z + 199]);
    float4 g20x = float4(conv_weights[64 * k + 192 * gid.z + 8], conv_weights[64 * k + 192 * gid.z + 72],
        conv_weights[64 * k + 192 * gid.z + 136], conv_weights[64 * k + 192 * gid.z + 200]);
    float4 g21x = float4(conv_weights[64 * k + 192 * gid.z + 9], conv_weights[64 * k + 192 * gid.z + 73],
        conv_weights[64 * k + 192 * gid.z + 137], conv_weights[64 * k + 192 * gid.z + 201]);
    float4 g22x = float4(conv_weights[64 * k + 192 * gid.z + 10], conv_weights[64 * k + 192 * gid.z + 74],
        conv_weights[64 * k + 192 * gid.z + 138], conv_weights[64 * k + 192 * gid.z + 202]);
    float4 g23x = float4(conv_weights[64 * k + 192 * gid.z + 11], conv_weights[64 * k + 192 * gid.z + 75],
        conv_weights[64 * k + 192 * gid.z + 139], conv_weights[64 * k + 192 * gid.z + 203]);
    float4 g30x = float4(conv_weights[64 * k + 192 * gid.z + 12], conv_weights[64 * k + 192 * gid.z + 76],
        conv_weights[64 * k + 192 * gid.z + 140], conv_weights[64 * k + 192 * gid.z + 204]);
    float4 g31x = float4(conv_weights[64 * k + 192 * gid.z + 13], conv_weights[64 * k + 192 * gid.z + 77],
        conv_weights[64 * k + 192 * gid.z + 141], conv_weights[64 * k + 192 * gid.z + 205]);
    float4 g32x = float4(conv_weights[64 * k + 192 * gid.z + 14], conv_weights[64 * k + 192 * gid.z + 78],
        conv_weights[64 * k + 192 * gid.z + 142], conv_weights[64 * k + 192 * gid.z + 206]);
```

FIG. 4B

```
float4 g33x = float4(conv_weights[64 * k + 192 * gid.z + 15], conv_weights[64 * k + 192 * gid.z + 79],
    conv_weights[64 * k + 192 * gid.z + 143], conv_weights[64 * k + 192 * gid.z + 207]);
float4 g00y = float4(conv_weights[64 * k + 192 * gid.z + 16], conv_weights[64 * k + 192 * gid.z + 80],
    conv_weights[64 * k + 192 * gid.z + 144], conv_weights[64 * k + 192 * gid.z + 208]);
float4 g01y = float4(conv_weights[64 * k + 192 * gid.z + 17], conv_weights[64 * k + 192 * gid.z + 81],
    conv_weights[64 * k + 192 * gid.z + 145], conv_weights[64 * k + 192 * gid.z + 209]);
float4 g02y = float4(conv_weights[64 * k + 192 * gid.z + 18], conv_weights[64 * k + 192 * gid.z + 82],
    conv_weights[64 * k + 192 * gid.z + 146], conv_weights[64 * k + 192 * gid.z + 210]);
float4 g03y = float4(conv_weights[64 * k + 192 * gid.z + 19], conv_weights[64 * k + 192 * gid.z + 83],
    conv_weights[64 * k + 192 * gid.z + 147], conv_weights[64 * k + 192 * gid.z + 211]);
float4 g10y = float4(conv_weights[64 * k + 192 * gid.z + 20], conv_weights[64 * k + 192 * gid.z + 84],
    conv_weights[64 * k + 192 * gid.z + 148], conv_weights[64 * k + 192 * gid.z + 212]);
float4 g11y = float4(conv_weights[64 * k + 192 * gid.z + 21], conv_weights[64 * k + 192 * gid.z + 85],
    conv_weights[64 * k + 192 * gid.z + 149], conv_weights[64 * k + 192 * gid.z + 213]);
float4 g12y = float4(conv_weights[64 * k + 192 * gid.z + 22], conv_weights[64 * k + 192 * gid.z + 86],
    conv_weights[64 * k + 192 * gid.z + 150], conv_weights[64 * k + 192 * gid.z + 214]);
float4 g13y = float4(conv_weights[64 * k + 192 * gid.z + 23], conv_weights[64 * k + 192 * gid.z + 87],
    conv_weights[64 * k + 192 * gid.z + 151], conv_weights[64 * k + 192 * gid.z + 215]);
float4 g20y = float4(conv_weights[64 * k + 192 * gid.z + 24], conv_weights[64 * k + 192 * gid.z + 88],
    conv_weights[64 * k + 192 * gid.z + 152], conv_weights[64 * k + 192 * gid.z + 216]);
float4 g21y = float4(conv_weights[64 * k + 192 * gid.z + 25], conv_weights[64 * k + 192 * gid.z + 89],
    conv_weights[64 * k + 192 * gid.z + 153], conv_weights[64 * k + 192 * gid.z + 217]);
float4 g22y = float4(conv_weights[64 * k + 192 * gid.z + 26], conv_weights[64 * k + 192 * gid.z + 90],
    conv_weights[64 * k + 192 * gid.z + 154], conv_weights[64 * k + 192 * gid.z + 218]);
float4 g23y = float4(conv_weights[64 * k + 192 * gid.z + 27], conv_weights[64 * k + 192 * gid.z + 91],
    conv_weights[64 * k + 192 * gid.z + 155], conv_weights[64 * k + 192 * gid.z + 219]);
float4 g30y = float4(conv_weights[64 * k + 192 * gid.z + 28], conv_weights[64 * k + 192 * gid.z + 92],
    conv_weights[64 * k + 192 * gid.z + 156], conv_weights[64 * k + 192 * gid.z + 220]);
float4 g31y = float4(conv_weights[64 * k + 192 * gid.z + 29], conv_weights[64 * k + 192 * gid.z + 93],
    conv_weights[64 * k + 192 * gid.z + 157], conv_weights[64 * k + 192 * gid.z + 221]);
float4 g32y = float4(conv_weights[64 * k + 192 * gid.z + 30], conv_weights[64 * k + 192 * gid.z + 94],
    conv_weights[64 * k + 192 * gid.z + 158], conv_weights[64 * k + 192 * gid.z + 222]);
float4 g33y = float4(conv_weights[64 * k + 192 * gid.z + 31], conv_weights[64 * k + 192 * gid.z + 95],
    conv_weights[64 * k + 192 * gid.z + 159], conv_weights[64 * k + 192 * gid.z + 223]);
float4 g00z = float4(conv_weights[64 * k + 192 * gid.z + 32], conv_weights[64 * k + 192 * gid.z + 96],
    conv_weights[64 * k + 192 * gid.z + 160], conv_weights[64 * k + 192 * gid.z + 224]);
float4 g01z = float4(conv_weights[64 * k + 192 * gid.z + 33], conv_weights[64 * k + 192 * gid.z + 97],
    conv_weights[64 * k + 192 * gid.z + 161], conv_weights[64 * k + 192 * gid.z + 225]);
float4 g02z = float4(conv_weights[64 * k + 192 * gid.z + 34], conv_weights[64 * k + 192 * gid.z + 98],
    conv_weights[64 * k + 192 * gid.z + 162], conv_weights[64 * k + 192 * gid.z + 226]);
float4 g03z = float4(conv_weights[64 * k + 192 * gid.z + 35], conv_weights[64 * k + 192 * gid.z + 99],
    conv_weights[64 * k + 192 * gid.z + 163], conv_weights[64 * k + 192 * gid.z + 227]);
float4 g10z = float4(conv_weights[64 * k + 192 * gid.z + 36], conv_weights[64 * k + 192 * gid.z + 100],
    conv_weights[64 * k + 192 * gid.z + 164], conv_weights[64 * k + 192 * gid.z + 228]);
float4 g11z = float4(conv_weights[64 * k + 192 * gid.z + 37], conv_weights[64 * k + 192 * gid.z + 101],
    conv_weights[64 * k + 192 * gid.z + 165], conv_weights[64 * k + 192 * gid.z + 229]);
```

FIG. 4C

```
float4 g12z = float4(conv_weights[64 * k + 192 * gid.z + 38], conv_weights[64 * k + 192 * gid.z +102],
    conv_weights[64 * k + 192 * gid.z + 166], conv_weights[64 * k + 192 * gid.z + 230]);
float4 g13z = float4(conv_weights[64 * k + 192 * gid.z + 39], conv_weights[64 * k + 192 * gid.z +103],
    conv_weights[64 * k + 192 * gid.z + 167], conv_weights[64 * k + 192 * gid.z + 231]);
float4 g20z = float4(conv_weights[64 * k + 192 * gid.z + 40], conv_weights[64 * k + 192 * gid.z +104],
    conv_weights[64 * k + 192 * gid.z + 168], conv_weights[64 * k + 192 * gid.z + 232]);
float4 g21z = float4(conv_weights[64 * k + 192 * gid.z + 41], conv_weights[64 * k + 192 * gid.z +105],
    conv_weights[64 * k + 192 * gid.z + 169], conv_weights[64 * k + 192 * gid.z + 233]);
float4 g22z = float4(conv_weights[64 * k + 192 * gid.z + 42], conv_weights[64 * k + 192 * gid.z +106],
    conv_weights[64 * k + 192 * gid.z + 170], conv_weights[64 * k + 192 * gid.z + 234]);
float4 g23z = float4(conv_weights[64 * k + 192 * gid.z + 43], conv_weights[64 * k + 192 * gid.z +107],
    conv_weights[64 * k + 192 * gid.z + 171], conv_weights[64 * k + 192 * gid.z + 235]);
float4 g30z = float4(conv_weights[64 * k + 192 * gid.z + 44], conv_weights[64 * k + 192 * gid.z +108],
    conv_weights[64 * k + 192 * gid.z + 172], conv_weights[64 * k + 192 * gid.z + 236]);
float4 g31z = float4(conv_weights[64 * k + 192 * gid.z + 45], conv_weights[64 * k + 192 * gid.z +109],
    conv_weights[64 * k + 192 * gid.z + 173], conv_weights[64 * k + 192 * gid.z + 237]);
float4 g32z = float4(conv_weights[64 * k + 192 * gid.z + 46], conv_weights[64 * k + 192 * gid.z +110],
    conv_weights[64 * k + 192 * gid.z + 174], conv_weights[64 * k + 192 * gid.z + 238]);
float4 g33z = float4(conv_weights[64 * k + 192 * gid.z + 47], conv_weights[64 * k + 192 * gid.z +111],
    conv_weights[64 * k + 192 * gid.z + 175], conv_weights[64 * k + 192 * gid.z + 239]);
float4 g00w = float4(conv_weights[64 * k + 192 * gid.z + 48], conv_weights[64 * k + 192 * gid.z +112],
    conv_weights[64 * k + 192 * gid.z + 176], conv_weights[64 * k + 192 * gid.z + 240]);
float4 g01w = float4(conv_weights[64 * k + 192 * gid.z + 49], conv_weights[64 * k + 192 * gid.z +113],
    conv_weights[64 * k + 192 * gid.z + 177], conv_weights[64 * k + 192 * gid.z + 241]);
float4 g02w = float4(conv_weights[64 * k + 192 * gid.z + 50], conv_weights[64 * k + 192 * gid.z +114],
    conv_weights[64 * k + 192 * gid.z + 178], conv_weights[64 * k + 192 * gid.z + 242]);
float4 g03w = float4(conv_weights[64 * k + 192 * gid.z + 51], conv_weights[64 * k + 192 * gid.z + 15],
    conv_weights[64 * k + 192 * gid.z + 179], conv_weights[64 * k + 192 * gid.z + 243]);
float4 g10w = float4(conv_weights[64 * k + 192 * gid.z + 52], conv_weights[64 * k + 192 * gid.z +116],
    conv_weights[64 * k + 192 * gid.z + 180], conv_weights[64 * k + 192 * gid.z + 244]);
float4 g11w = float4(conv_weights[64 * k + 192 * gid.z + 53], conv_weights[64 * k + 192 * gid.z +117],
    conv_weights[64 * k + 192 * gid.z + 181], conv_weights[64 * k + 192 * gid.z + 245]);
float4 g12w = float4(conv_weights[64 * k + 192 * gid.z + 54], conv_weights[64 * k + 192 * gid.z +118],
    conv_weights[64 * k + 192 * gid.z + 182], conv_weights[64 * k + 192 * gid.z + 246]);
float4 g13w = float4(conv_weights[64 * k + 192 * gid.z + 55], conv_weights[64 * k + 192 * gid.z +119],
    conv_weights[64 * k + 192 * gid.z + 183], conv_weights[64 * k + 192 * gid.z + 247]);
float4 g20w = float4(conv_weights[64 * k + 192 * gid.z + 56], conv_weights[64 * k + 192 * gid.z +120],
    conv_weights[64 * k + 192 * gid.z + 184], conv_weights[64 * k + 192 * gid.z + 248]);
float4 g21w = float4(conv_weights[64 * k + 192 * gid.z + 57], conv_weights[64 * k + 192 * gid.z +121],
    conv_weights[64 * k + 192 * gid.z + 185], conv_weights[64 * k + 192 * gid.z + 249]);
float4 g22w = float4(conv_weights[64 * k + 192 * gid.z + 58], conv_weights[64 * k + 192 * gid.z +122],
    conv_weights[64 * k + 192 * gid.z + 186], conv_weights[64 * k + 192 * gid.z + 250]);
```

FIG. 4D

```
float4 g23w = float4(conv_weights[64 * k + 192 * gid.z + 59], conv_weights[64 * k + 192 * gid.z +123],
    conv_weights[64 * k + 192 * gid.z + 187], conv_weights[64 * k + 192 * gid.z + 251]);
float4 g30w = float4(conv_weights[64 * k + 192 * gid.z + 60], conv_weights[64 * k + 192 * gid.z +124],
    conv_weights[64 * k + 192 * gid.z + 188], conv_weights[64 * k + 192 * gid.z + 252]);
float4 g31w = float4(conv_weights[64 * k + 192 * gid.z + 61], conv_weights[64 * k + 192 * gid.z +125],
    conv_weights[64 * k + 192 * gid.z + 189], conv_weights[64 * k + 192 * gid.z + 253]);
float4 g32w = float4(conv_weights[64 * k + 192 * gid.z + 62], conv_weights[64 * k + 192 * gid.z +126],
    conv_weights[64 * k + 192 * gid.z + 190], conv_weights[64 * k + 192 * gid.z + 254]);
float4 g33w = float4(conv_weights[64 * k + 192 * gid.z + 63], conv_weights[64 * k + 192 * gid.z +127],
    conv_weights[64 * k + 192 * gid.z + 191], conv_weights[64 * k + 192 * gid.z + 255]);

float4 d00 = x00 - x02 - x20 + x22;
float4 d01 = -x01 + x02 + x21 - x22;
float4 d02 = x01 + x02 - x21 - x22;
float4 d03 = -x01 + x03 + x21 - x23;
float4 d10 = -x10 + x12 + x20 - x22;
float4 d11 = x11 - x12 - x21 + x22;
float4 d12 = -x11 - x12 + x21 + x22;
float4 d13 = x11 - x13 - x21 + x23;
float4 d20 = x10 - x12 + x20 - x22;
float4 d21 = -x11 + x12 - x21 + x22;
float4 d22 = x11 + x12 + x21 + x22;
float4 d23 = -x11 + x13 - x21 + x23;
float4 d30 = -x10 + x12 + x30 - x32;
float4 d31 = x11 - x12 - x31 + x32;
float4 d32 = -x11 - x12 + x31 + x32;
float4 d33 = x11 - x13 - x31 + x33;

float4 xh00 = d00 * g00x;
float4 xh01 = d01 * g01x;
float4 xh02 = d02 * g02x;
float4 xh03 = d03 * g03x;
float4 xh10 = d10 * g10x;
float4 xh11 = d11 * g11x;
float4 xh12 = d12 * g12x;
float4 xh13 = d13 * g13x;
float4 xh20 = d20 * g20x;
float4 xh21 = d21 * g21x;
float4 xh22 = d22 * g22x;
float4 xh23 = d23 * g23x;
float4 xh30 = d30 * g30x;
float4 xh31 = d31 * g31x;
float4 xh32 = d32 * g32x;
float4 xh33 = d33 * g33x;
float4 yh00 = d00 * g00y;
float4 yh01 = d01 * g01y;
float4 yh02 = d02 * g02y;
float4 yh03 = d03 * g03y;
```

FIG. 4E

```
float4 yh10 = d10 * g10y;
float4 yh11 = d11 * g11y;
float4 yh12 = d12 * g12y;
float4 yh13 = d13 * g13y;
float4 yh20 = d20 * g20y;
float4 yh21 = d21 * g21y;
float4 yh22 = d22 * g22y;
float4 yh23 = d23 * g23y;
float4 yh30 = d30 * g30y;
float4 yh31 = d31 * g31y;
float4 yh32 = d32 * g32y;
float4 yh33 = d33 * g33y;
float4 zh00 = d00 * g00z;
float4 zh01 = d01 * g01z;
float4 zh02 = d02 * g02z;
float4 zh03 = d03 * g03z;
float4 zh10 = d10 * g10z;
float4 zh11 = d11 * g11z;
float4 zh12 = d12 * g12z;
float4 zh13 = d13 * g13z;
float4 zh20 = d20 * g20z;
float4 zh21 = d21 * g21z;
float4 zh22 = d22 * g22z;
float4 zh23 = d23 * g23z;
float4 zh30 = d30 * g30z;
float4 zh31 = d31 * g31z;
float4 zh32 = d32 * g32z;
float4 zh33 = d33 * g33z;
float4 wh00 = d00 * g00w;
float4 wh01 = d01 * g01w;
float4 wh02 = d02 * g02w;
float4 wh03 = d03 * g03w;
float4 wh10 = d10 * g10w;
float4 wh11 = d11 * g11w;
float4 wh12 = d12 * g12w;
float4 wh13 = d13 * g13w;
float4 wh20 = d20 * g20w;
float4 wh21 = d21 * g21w;
float4 wh22 = d22 * g22w;
float4 wh23 = d23 * g23w;
float4 wh30 = d30 * g30w;
float4 wh31 = d31 * g31w;
float4 wh32 = d32 * g32w;
float4 wh33 = d33 * g33w;
```

FIG. 4F

```
float4 c00x = xh00 + xh01 + xh02 + xh10 + xh11 + xh12 + xh20 + xh21 + xh22;
float4 c01x = -xh01 + xh02 + xh03 - xh11 + xh12 + xh13 - xh21 + xh22 + xh23;
float4 c02x = -xh10 - xh11 - xh12 + xh20 + xh21 + xh22 + xh30 + xh31 + xh32;
float4 c03x = xh11 - xh12 - xh13 - xh21 + xh22 + xh23 - xh31 + xh32 + xh33;
float4 c00y = yh00 + yh01 + yh02 + yh10 + yh11 + yh12 + yh20 + yh21 + yh22;
float4 c01y = -yh01 + yh02 + yh03 - yh11 + yh12 + yh13 - yh21 + yh22 + yh23;
float4 c02y = -yh10 - yh11 - yh12 + yh20 + yh21 + yh22 + yh30 + yh31 + yh32;
float4 c03y = yh11 - yh12 - yh13 - yh21 + yh22 + yh23 - yh31 + yh32 + yh33;
float4 c00z = zh00 + zh01 + zh02 + zh10 + zh11 + zh12 + zh20 + zh21 + zh22;
float4 c01z = -zh01 + zh02 + zh03 - zh11 + zh12 + zh13 - zh21 + zh22 + zh23;
float4 c02z = -zh10 - zh11 - zh12 + zh20 + zh21 + zh22 + zh30 + zh31 + zh32;
float4 c03z = zh11 - zh12 - zh13 - zh21 + zh22 + zh23 - zh31 + zh32 + zh33;
float4 c00w = wh00 + wh01 + wh02 + wh10 + wh11 + wh12 + wh20 + wh21 + wh22;
float4 c01w = -wh01 + wh02 + wh03 - wh11 + wh12 + wh13 - wh21 + wh22 + wh23;
float4 c02w = -wh10 - wh11 - wh12 + wh20 + wh21 + wh22 + wh30 + wh31 + wh32;
float4 c03w = wh11 - wh12 - wh13 - wh21 + wh22 + wh23 - wh31 + wh32 + wh33;

result00x += c00x;
result01x += c01x;
result02x += c02x;
result03x += c03x;
result00y += c00y;
result01y += c01y;
result02y += c02y;
result03y += c03y;
result00z += c00z;
result01z += c01z;
result02z += c02z;
result03z += c03z;
result00w += c00w;
result01w += c01w;
result02w += c02w;
result03w += c03w;
}
```

FIG. 4G

```
float4 result00f = bias + float4(result00x.x + result00x.y + result00x.z + result00x.w, result00y.x
              + result00y.y + result00y.z + result00y.w, result00z.x + result00z.y + result00z.z
              + result00z.w, result00w.x + result00w.y + result00w.z + result00w.w);
float4 result01f = bias + float4(result01x.x + result01x.y + result01x.z + result01x.w, result01y.x
              + result01y.y + result01y.z + result01y.w, result01z.x + result01z.y + result01z.z
              + result01z.w, result01w.x + result01w.y + result01w.z + result01w.w);
float4 result02f = bias + float4(result02x.x + result02x.y + result02x.z + result02x.w, result02y.x
              + result02y.y + result02y.z + result02y.w, result02z.x + result02z.y + result02z.z
              + result02z.w, result02w.x + result02w.y + result02w.z + result02w.w);
float4 result03f = bias + float4(result03x.x + result03x.y + result03x.z + result03x.w, result03y.x
              + result03y.y + result03y.z + result03y.w, result03z.x + result03z.y + result03z.z
              + result03z.w, result03w.x + result03w.y + result03w.z + result03w.w);

result00f = max(result00f, float4(0.0f));
result01f = max(result01f, float4(0.0f));
result02f = max(result02f, float4(0.0f));
result03f = max(result03f, float4(0.0f));

outputTexture.write(result00f, uint2(2 * gid.x + 0, 2 * gid.y + 0), gid.z);
outputTexture.write(result01f, uint2(2 * gid.x + 0, 2 * gid.y + 1), gid.z);
outputTexture.write(result02f, uint2(2 * gid.x + 1, 2 * gid.y + 0), gid.z);
outputTexture.write(result03f, uint2(2 * gid.x + 1, 2 * gid.y + 1), gid.z);
}
```

FIG. 4H

SYSTEMS AND METHODS FOR PROCESSING CONVOLUTIONAL NEURAL NETWORK OPERATIONS USING TEXTURES

FIELD

This disclosure relates to systems and methods that processes convolutional neural network operations using textures, wherein layers of a convolutional neural network are formatted as shaders.

BACKGROUND

Processing convolutional neural network operations may be time consuming. Parallelizing threads of convolutional neural network operations may increase the speed of processing convolutional neural network operations. Such parallelizing methods may be limited by the use of one-dimensional weights and/or buffers.

SUMMARY

This disclosure relates to processing convolutional neural network operations using textures. Convolutional neural network information may define a convolutional neural network including layers. The layers may define operations on an input to the convolutional neural network. The layers in the convolutional neural network information may be formatted as shaders. Input information defining the input to the convolutional neural network may be accessed. The input information may be formatted as an array of textures. The shaders may be applied to the textures to effectuate processing the input to the convolutional neural network through the layers of the convolutional neural network. One or more results may be obtained from applying the shaders to the array of textures.

A system that processes convolutional neural network operations using textures may include one or more of physical storage media, processors, and/or other components. In some implementations, the system may include one or more graphics processing units. In some implementations, the graphics processing unit may be included in a mobile device. In some implementations, the system may include a graphics processing unit memory. The physical storage media may store convolutional neural network information and/or other information. The convolutional neural network information may define one or more convolutional neural networks. A convolutional neural network may include one or more layers. The layers may define one or more operations on an input to the convolutional neural network. The layers in the convolutional neural network information may be formatted as shaders. In some implementations, the layers of the convolutional neural network may include one or more convolution layers. The convolution layers may be processed using binary convolution.

The processor(s) may be configured by machine-readable instructions. Executing the machine-readable instructions may cause the processor(s) to facilitate processing convolutional neural network operations using textures. The machine-readable instructions may include one or more computer program components. The computer program components may include one or more of an access component, a shader component, a result component, and/or other computer program components. In some implementations, the computer program component may include an input conversion component. In some implementation, the computer program component may include a shader conversion component.

The shader conversion component may be configured to access layer information and/or other information. The layer information may defining one or more layers of a convolutional neural network. The shader conversion component may be configured to format one or more operations defined by the layer(s) as one or more of the shaders and/or other information. The shader conversion component may be configured to add the shaders and/or other information to the convolutional neural network information.

The access component may be configured to access input information and/or other information. The input information may define one or more inputs to the convolutional neural network. The input information may be formatted as an array of textures. The textures may be characterized by a width, a height, a number of channels, and/or other characteristics. In some implementations, the number of channels of the textures may be four. In some implementations, the array of textures may be stored using an int32 structure. The int32 structure may include four int8 structures. An individual int8 structure may store a four by two patch of a single channel of an individual texture.

The input conversion component may be configured to access one or more inputs and/or other information. The input conversion component may be configured to format the input as array of textures. The input conversion component may be configured to store the array of textures as the input information.

The shader component may be configured to apply the shaders to the array of textures. Applying the shaders to the array of textures may effectuate processing the input(s) to the convolutional neural network through the layers of the convolutional neural network. In some implementations, individual shaders may output information for four channels. In some implementation, the shaders may be applied to the array of textures by the graphics processing unit. In some implementations, one or more inputs to the shaders and one or more outputs of the shaders may be stored in the graphics processing unit memory.

The result component may be configured to obtain one or more results from applying the shaders to the array of textures and/or other information. The result component may perform and/or obtain results from one or more processes that perform GPU to CPU conversion on the results of applying the shaders to the array of textures. The results component may obtain one or more results as one or more tensors, which may be used for additional operations These and other objects, features, and characteristics of the system and/or method disclosed herein, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of "a", "an", and "the" include plural referents unless the context clearly dictates otherwise.

BRIEF DESCRIPTION OF THE DRAWINGS

FIG. 3A illustrates a formulation of convolutional layer output.

FIG. 3B illustrates a formulation of computing a weights average amplitude.

FIG. 3C illustrates a formulation of a convolution.

FIGS. 4A-4H illustrates operations of a convolutional neural network formatted as shader.

DETAILED DESCRIPTION

Figure 1:
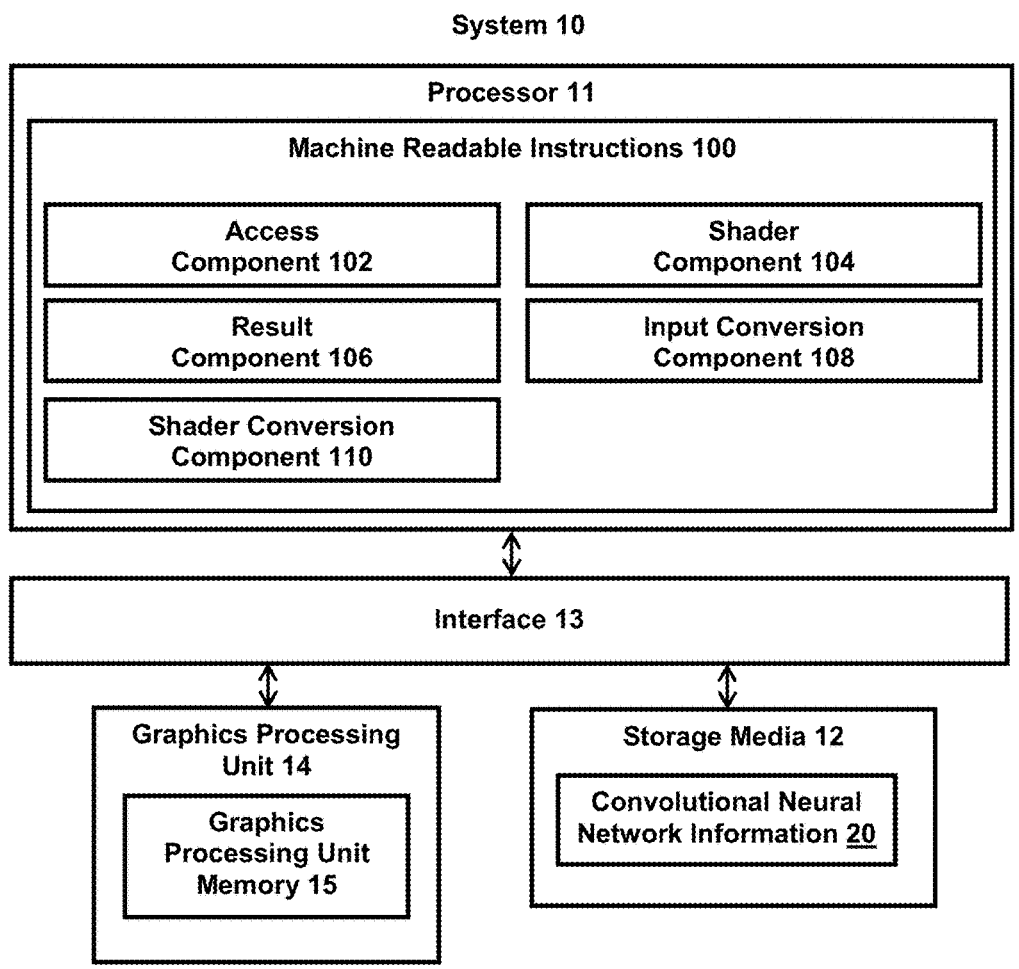
FIG. 1 illustrates a system that processes convolutional neural network operations using textures.

FIG. 1 illustrates system 10 for processing convolutional neural network operations using textures. System 10 may include one or more of processor 11, storage media 12, interface 13 (e.g., bus, wireless interface), and/or other components. In some implementations, system 10 may include one or more graphics processing unit 14. In some implementations, graphics processing unit 14 may be included in a mobile device (e.g., smartphone, tablet, camera). In some implementations, system 10 may include graphics processing unit memory 15. Graphics processing unit memory 15 may be a part of graphics processing unit 14 (as shown in FIG. 1) and/or may be separate from graphics processing unit 14. Convolutional neural network information 20 may define a convolutional neural network including layers. The layers may define operations on an input to the convolutional neural network. The layers in convolutional neural network information 20 may be formatted as shaders. Input information defining the input to the convolutional neural network may be accessed. The input information may be formatted as an array of textures. The shaders may be applied to the textures to effectuate processing the input to the convolutional neural network through the layers of the convolutional neural network. One or more results may be obtained from applying the shaders to the array of textures.

Storage media 12 may be configured to include electronic storage medium that electronically stores information. Storage media 12 may store software algorithms, information determined by processor 11, information received remotely, and/or other information that enables system 10 to function properly. For example, electronic 12 may store information relating to convolutional neural network, layers, shaders, inputs, textures, and/or other information.

Storage media 12 may store convolutional neural network information 20 and/or other information. Convolutional neural network information 20 may define one or more convolutional neural networks. A convolutional neural network may refer to a neural network that receives an input and transforms the input through a series of layers. A convolutional neural network may include a series of linear and non-linear operations applied to an input tensor of data. A convolutional neural network may include one or more layers. For example, a convolutional neural network may include one or more of an input layer, an output layer, a convolution layer, a padding layer, a squeeze layer, an expand layer, a concatenation layer, a combine layer, a pooling layer, a normalization layer, a fully-connected layer, an activation layer, a drop layer, a flatten layer, and/or other layers. The layers may define one or more operations on an input to the convolutional neural network. The layers in the convolutional neural network information may be formatted as shaders. Shaders may refer programs/modules used to process shading—process color productions/visual transformation—within an image.

In some implementations, convolution layers may be processed using binary convolution. Binary convolution may provide for faster computational time of convolution at the expense of precision loss. For example, an input image (position (i, j), channel k) may be denoted as $I_{i,j,k}$. Convolutional layer output $O_{x,y,z}$ may be defined as shown in FIG. 3A. In FIG. 3A, alpha may represent weights of a filter. Beta may represent a bias. Sigma may represent an activation function, such as hyperbolic tangent, rectified linear unit, leaky rectified linear unit, and/or other activation functions. W and H may denote the size of the filter, and D may denote the number of input channels. The principle of binary convolutions may include computing a weights average amplitude (as shown in FIG. 3B) and an input tensor subsampling amplitude I' (same formula with I on the sampled patch of the formula for O in FIG. 3A). The convolution may be written as shown in FIG. 3C, where the binary values of the input tensor (+1 if positive; −1 if negative) is denoted as $I_b$ and the binary version of the weights is denoted as $\alpha_b$. The binary convolution ($I_b$ star $\alpha_b$) may be computed with bitwise operations (XOR). Uses of other convolutions are contemplated.

Processor 11 may be configured to provide information processing capabilities in system 10. As such, processor 11 may comprise one or more of a digital processor, an analog processor, a digital circuit designed to process information, a central processing unit, a graphics processing unit, a microcontroller, an analog circuit designed to process information, a state machine, and/or other mechanisms for electronically processing information. Processor 11 may be configured to execute one or more machine readable instructions 100 to facilitate processing convolutional neural network operations using textures. Machine readable instructions 100 may include one or more computer program components. Machine readable instructions 100 may include one or more of access component 102, shader component 104, result component 106, and/or other computer program components. In some implementations, machine readable instructions 100 may include input conversion component 108. In some implementation, machine readable instructions 100 may include shader conversion component 110.

Shader conversion component 110 may be configured to access layer information and/or other information. Layer information may defining one or more layers of a convolutional neural network. Shader conversion component 110 may access layer information from one or more storage locations. A storage location may include storage media 12, electronic storage of other device(s), and/or other locations. For example, shader conversion component 110 may access layer information stored in storage media 12. Shader conversion component 110 may access layer information associated with convolutional neural network information 20.

Shader conversion component 110 may be configured to format one or more operations defined by the layer(s) as one or more shaders and/or other information. One or more shaders may be characterized by parameters that define operations to be performed on one or more textures. For example, shaders may be characterized by biases parameters, weights parameters, input texture read parameters, output texture write parameters, and/or other parameters. FIGS. 4A-4H illustrates an example of operations of a convolutional neural network formatted as shader. Shader conversion component 110 may be configured to add the shaders and/or other information to convolutional neural network information 20.

Shader conversion component 110 may detect the layers (convolution layers and/or other layers) of the convolutional neural network and create shaders for the layers. In some implementations, the shaders may be optimized for the layer. Shader conversion component 110 may convert weights of the layers into texture. The weights of the convolutional operation may be stored in multichannel stack. The size of the shaders may be determined based on the size of the filter size. In some implementations, the size of the shaders may be constrained to a small area. Constraining the size of the shaders to a small area may provide for faster processing speed.

The shaders may write into output tensors based on input tensors. The shaders may compute multiple channels instead of a single channel. Use of shaders that processes on multiple channels may increase parallelization of processing convolutional neural network operations. For example, individual shaders may output information for four channels—individual shaders may compute four channels instead of a single channel. Computing on four channels may enable the shaders to sample approximately four times faster. Other numbers of channels are contemplated. Sampling may take longer than other aspects of the shaders operations in terms of time and increasing the speed of the sampling may result in faster processing of convolutional neural network operations.

Figure 5:
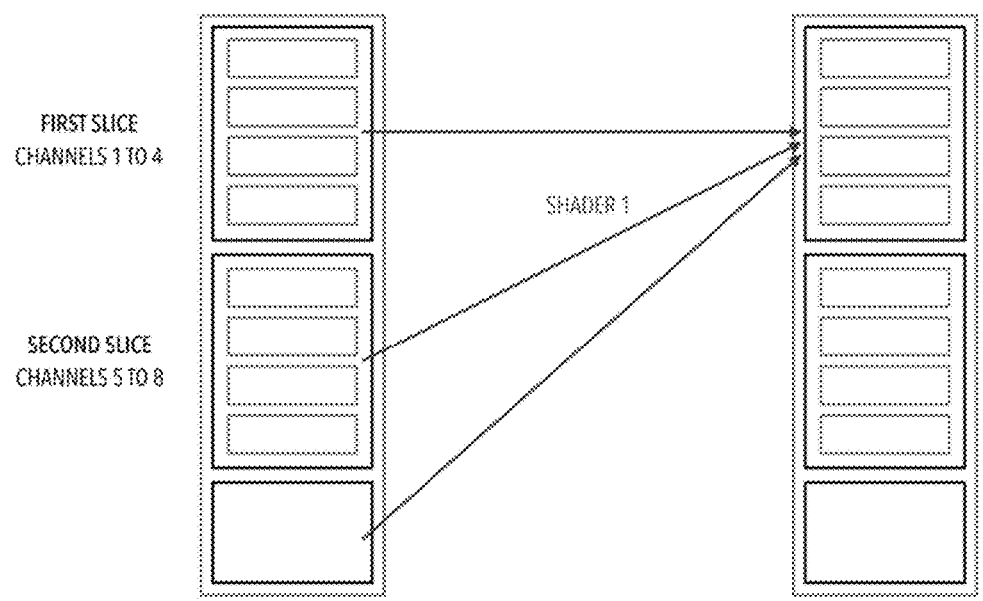
FIG. 5 illustrates example slices of a shader grid for a convolution operation.
Figure 6:
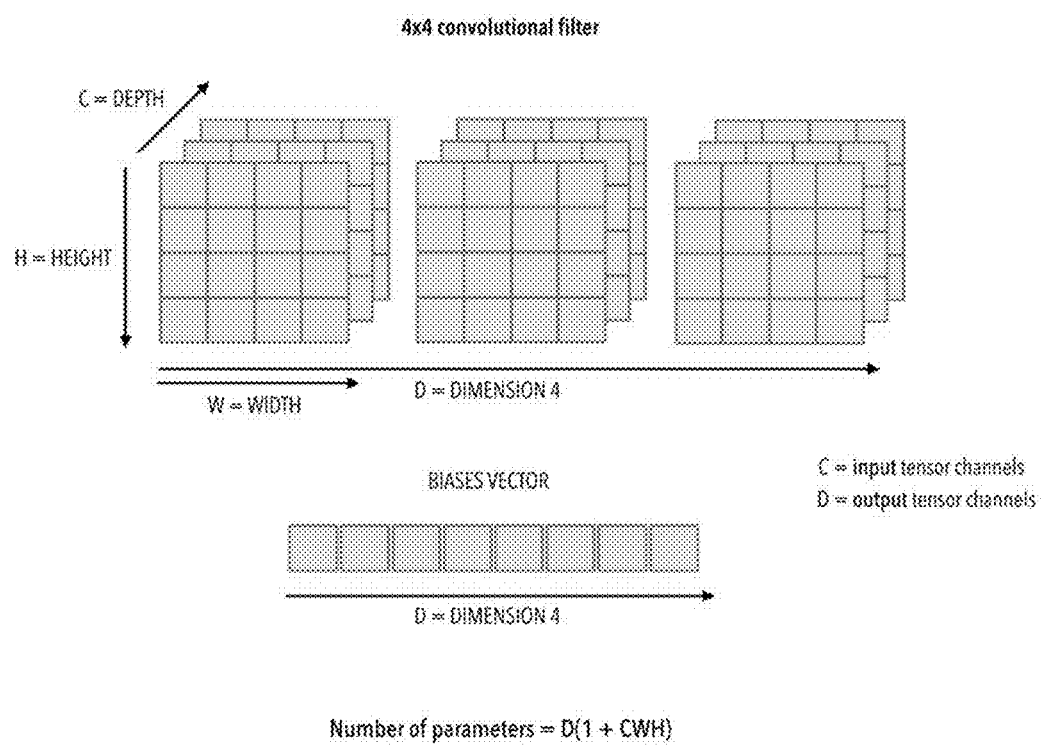
FIG. 6 illustrates an example schematic showing weights storage in a 3D array.

For example, FIG. 5 illustrates example slices of a shader grid for a 1×1 convolution operation. Each shader may take all channels of each pixels to compute four channels of the output with four separate convolutional inside the same shader. The number of shaders may equal W×H×D/4, where W is the width of the input/output tensor, H the height of the input/output tensor, and D the number of channels of the output tensor. The number of parameters may equal D+C×D, where C is the number of input channels (weights and one bias per output filter). For convolutions on a bigger patch, for example for 3×3 patch, each shader may use all channels of 3×3 pixels to product four output channels. In such a case, the number of parameters may equal D+9+C×D. FIG. 6 illustrates an example schematic showing weights storage in a 3D array. Convolutional filter may be characterized by height (H), width (W), depth (C), and dimension (D). Biases vector may be characterized by dimension (D). In some implementations, Winograd type algorithms may be used to improve the computational time of convolutions.

Input information may define one or more inputs to a convolutional neural network. Inputs into a convolutional neural network may include visual content (e.g., one or more images, one or more videos). An input image may be characterized by an input tensor of three dimensions (three-dimensional data)—two spatial dimensions (e.g., x, y) and one depth/channel dimension (e.g., color space, such as RGB). Other types of input/dimensions are contemplated.

Input information may be formatted as one or more arrays of textures. The textures may be characterized by a width, a height, a number of channels, and/or other characteristics. In some implementations, the number of channels of the textures may be four. For example, three-dimensional data of an image input tensor may be stored in a Texture2DArray structure and/or other structures. The type of data inside the structure may be RGBA floating point 32 (four values) or half-floating point 16 (e.g., IEEE 754 half-precision binary floating-point format). Each point (x, y) may store a number of c channels and each channel may contain four values. Because each channel contains four values, the depth of the tensor may be the number of channels of the input image divided by four, and sampling may be approximately four times faster.

Figure 7:
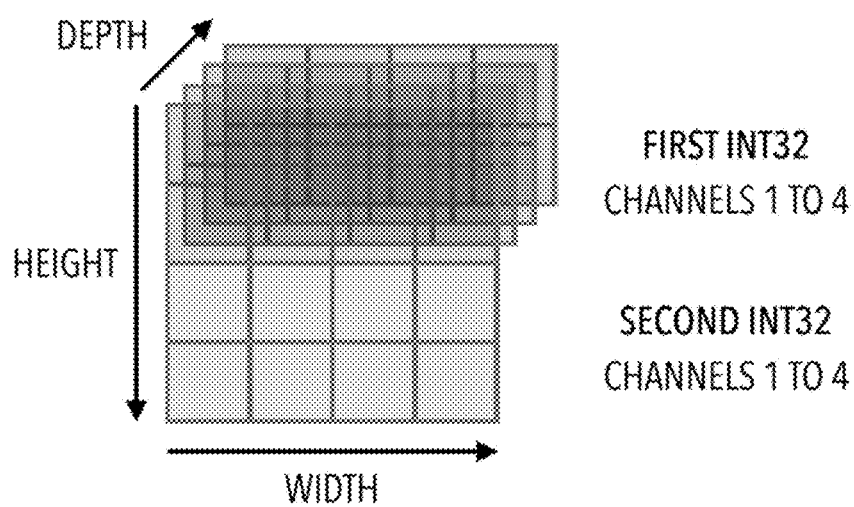
FIG. 7 illustrates example int32 structure.

In some implementations, the array of textures may be stored using an int32 structure. The int32 structure may include four int8 structures. An individual int8 structure may store a four by two patch of a single channel of an individual texture. FIG. 7 illustrates two int32 structures. Int32 structures may be characterized by a width, a height, and a depth. FIG. 7 shows four int8 structures of the first int32 structure. First int32 structure may store 8 pixels and four channels. Each square may store a value in binary (e.g., carry a value of one or zero). Thus, each int32 may store eight spatial values for four channels.

Int32 structure may be used to store input, output, filters, and/or other values. Storage of values in spatial binary storage may facilitate computation of binary convolutions. Using a XOR operation, the output values for a convolution may be computed (e.g., summing the components of resulting int8 after product with the amplitudes). The binary format for an int8 may be "abcdefgh," where each letter belongs to $\{0,1\}$. A transformation $2*(x-\frac{1}{2})$ may be performed before and after the calculation to recenter the data after the XOR operation. The int32 structure may be used for 4×4 convolutions. Other size convolutions may use the int32 structure through padding (e.g., for 3×3 convolutions), through duplication (e.g., for multiples of 4×4 convolutions), or through both padding and duplication.

Access component 102 may be configured to access input information and/or other information. Access component 102 may access input information from one or more storage locations. A storage location may include storage media 12, electronic storage of one or more image sensors (not shown in FIG. 1), and/or other locations. For example, access component 102 may access input information stored in storage media 12. In some implementations, input information may define one or more visual content (e.g., image, video). Access component 102 may access input information defining one or more visual content during acquisition of the visual content and/or after acquisition of the visual content by one or more image sensors. For example, access component 102 may access input information defining an image/video while the image/video is being captured by one or more image sensors. Access component 102 may access input information defining an image/video after the image/video has been captured and stored in memory (e.g., storage media 12).

Input conversion component 108 may be configured to access one or more inputs and/or other information. For example, input conversion component 108 may be configured to access one or more of images, videos, and/or other information as input into a convolutional neural network. Input conversion component 108 may be configured to access inputs and/or other information during acquisition of the input/information and/or after acquisition of the input/information (e.g., by one or more image sensors). For example, input conversion component 108 may access input defining an image/video while the image/video is being captured by one or more image sensors. Input conversion component 108 may access input defining an image/video after the image/video has been captured and stored in memory (e.g., storage media 12).

Input conversion component 108 may be configured to format the input as array of textures. Input conversion component 108 may format the input using the Texture2DArray structure and/or the int32 structure. Inputs conversion component 108 may split input tensor into stacks of textures. Individual textures may contain information regarding the input on up to a certain number of channels. For example, individual textures may contain information regarding the input on up to four channels. For example, an input tensor with four channels may be stored in one texture. An input tensor with eight channels may be stored in two textures. An input tensor with five hundred channels may be stored in a hundred and twenty five textures. The depth of the number may equal the number of channels of the input divided by four. Other numbers of channels are contemplated. Input conversion component 108 may be configured to store the array of textures as input information. Input information stored by input conversion component 108 may be accessed by access component 102

Shader component 104 may be configured to apply the shaders to the array of textures. Shaders may be applied to the textures by sampling (extracting data from certain positions) and writing on output textures after a computation (a layer) is applied to the sampled data. In some implementations, sampling may include one-to-one sampling. In some implementations, sampling may include other operations, such as application of filters (e.g., bilateral filtering) and/or other operations.

Individual shaders may write to a set number of channels (e.g., four channels) of the output. For example, for writing to sixty-four channels in an output, sixteen shaders writing to four channels may be used. Applying the shaders to the array of textures may effectuate processing the input(s) to the convolutional neural network through the layers of the convolutional neural network. Parallelization of the shaders/textures in multiple channels may increase the speed of processing convolutional neural network operations.

The shaders may be applied to the array of textures by graphics processing unit 14. Graphics processing unit 14 may process textures/images in parallel. For example, graphics processing unit 14 may apply shaders to textures/images with RGBA channels in parallel. Graphics processing unit 14 may apply shaders to multiple textures/images in parallel. Parallelization of the processes in both space and depth may enable faster processing of the operations of the convolutional neural network. In some implementations, processing/parallelization by graphics processing unit 14 may be effectuated via one or more application programming interfaces/frameworks (e.g., Apple Metal).

In some implementations, one or more inputs to the shaders and one or more outputs of the shaders may be stored in graphics processing unit memory 15. Graphics processing unit memory 15 may be a part of graphics processing unit 14 (as shown in FIG. 1) and/or may be separate from graphics processing unit 14. Graphics processing unit memory 15 may provide a common buffer for inputs and outputs of one or more shaders. Use of graphics processing unit memory 15 to store and retrieve operations performed by the shaders may enable more efficient and faster storage/retrieval operations than if the inputs and/or outputs of the shaders are stored in other locations and/or processed by a CPU (e.g., processor 11). The shaders may take as input what is stored in graphics processing unit memory 15 (output of the prior shader) and may write output to graphics processing unit memory (for the next shader to take as input). Such use of graphics processing unit memory 15 as a common buffer may enable processing of one layer of a convolutional neural network to another layer of the convolutional neural network without returning to a CPU (e.g., processor 11).

Figure 8:
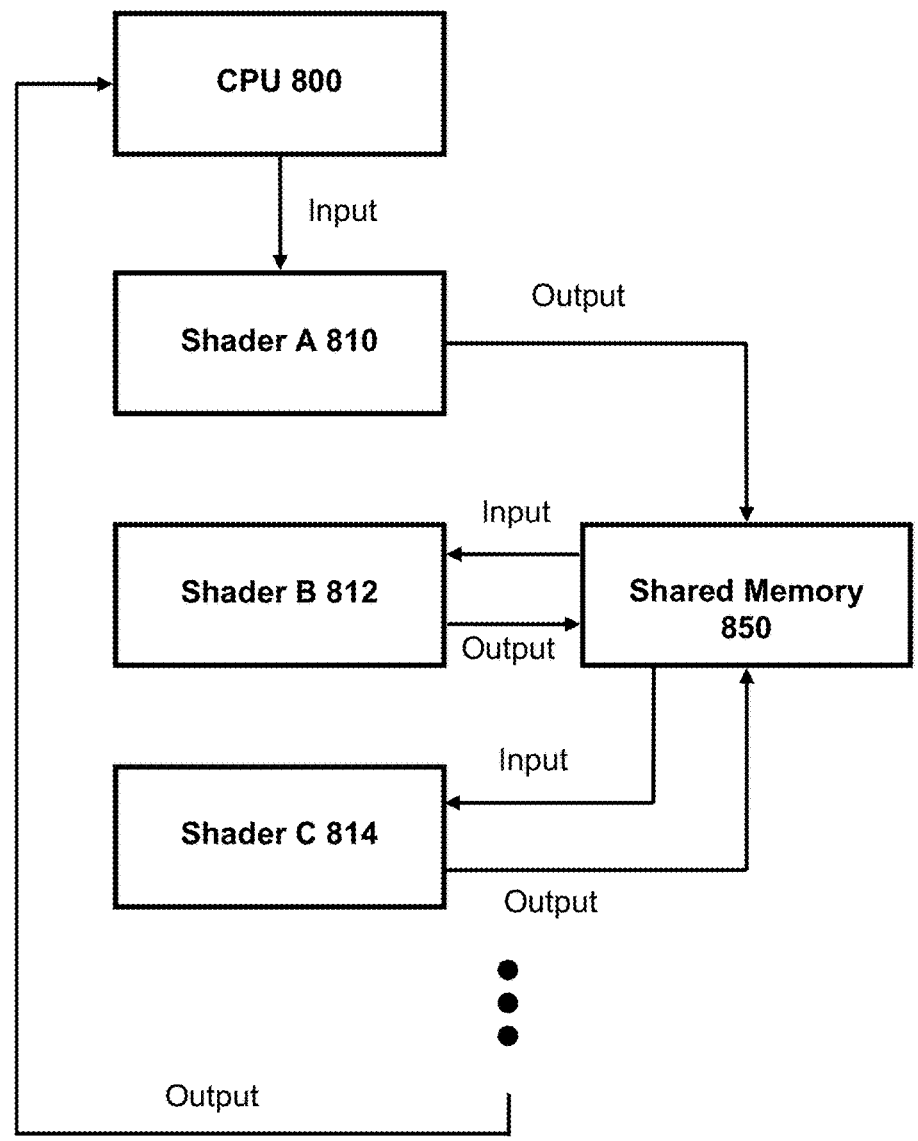
FIG. 8 illustrates an example processing flow using a shared memory.

For example, FIG. 8 illustrates an example processing flow using shared memory 850. In FIG. 8, CPU 800 may pass to shader A 810 an input. Shader A 810 may perform operations on the input and write its output in shared memory 850. Shader B 812 may take as its input the output written in shared memory 850 by shader A 810. Shader B 812 may perform operations on the input and write its output in shared memory 850. Shader C 814 may take as its input the output written in shared memory 850 by shader B 812. Shader C 814 may perform operations on the input and write its output in shared memory 850. Operations of the shaders may proceed in such fashion until the output of the final shader is sent back to CPU 800.

Result component 106 may be configured to obtain one or more results from applying the shaders to the array of textures and/or other information. Result component 106 may obtain one or more results from the application of the last shader to the array of textures. Result component 106 may be configured to obtain one or more results from one or more earlier applications of the shaders to the array of textures. Result component 106 may perform and/or obtain results from one or more processes that perform GPU to CPU conversion on the results of applying the shaders to the array of textures. Results component 106 may obtain one or more results as one or more tensors, which may be used for additional operations, such as calculation, display, printing, and/or other operations.

Although processor 11 is shown in FIG. 1 as a single entity, this is for illustrative purposes only. In some implementations, processor 11 may comprise a plurality of processing units. These processing units may be physically located within the same device, or processor 11 may represent processing functionality of a plurality of devices operating in coordination. Processor 11 may be configured to execute one or more components by software; hardware; firmware; some combination of software, hardware, and/or firmware; and/or other mechanisms for configuring processing capabilities on processor 11.

Although graphics processing unit 14 is shown in FIG. 1 as a single entity, this is for illustrative purposes only. In some implementations, graphics processing unit 14 may comprise a plurality of graphics processing units. These graphics processing units may be physically located within the same device, or graphics processing unit 14 may represent graphic processing functionality of a plurality of devices operating in coordination. Graphics processing unit 14 may be configured to execute one or more components by software; hardware; firmware; some combination of software, hardware, and/or firmware; and/or other mechanisms for configuring graphics processing capabilities on graphics processing unit 14

It should be appreciated that although computer components are illustrated in FIG. 1 as being co-located within a single processing unit, in implementations in which processor 11 comprises multiple processing units, one or more of computer program components may be located remotely from the other computer program components.

The description of the functionality provided by the different computer program components described herein is for illustrative purposes, and is not intended to be limiting, as any of computer program components may provide more or less functionality than is described. For example, one or more of computer program components 102, 104, 106, 108, and/or 110 may be eliminated, and some or all of its functionality may be provided by other computer program components. As another example, processor 11 may be configured to execute one or more additional computer program components that may perform some or all of the functionality attributed to one or more of computer program components 102, 104, 106, 108, and/or 110 described herein.

The electronic storage media of storage media 12 may be provided integrally (i.e., substantially non-removable) with one or more components of system 10 and/or removable storage that is connectable to one or more components of system 10 via, for example, a port (e.g., a USB port, a Firewire port, etc.) or a drive (e.g., a disk drive, etc.). Storage media 12 may include one or more of optically readable storage media (e.g., optical disks, etc.), magnetically readable storage media (e.g., magnetic tape, magnetic hard drive, floppy drive, etc.), electrical charge-based storage media (e.g., EPROM, EEPROM, RAM, etc.), solid-state storage media (e.g., flash drive, etc.), and/or other electronically readable storage media. Storage media 12 may be a separate component within system 10, or storage media 12 may be provided integrally with one or more other components of system 10 (e.g., processor 11). Although storage media 12 is shown in FIG. 1 as a single entity, this is for illustrative purposes only. In some implementations, storage media 12 may comprise a plurality of storage units. These storage units may be physically located within the same device, or storage media 12 may represent storage functionality of a plurality of devices operating in coordination.

The electronic storage media of graphics processing unit memory 15 may be provided integrally (i.e., substantially non-removable) with one or more components of system 10 and/or removable storage that is connectable to one or more components of system 10 via, for example, a port (e.g., a USB port, a Firewire port, etc.) or a drive (e.g., a disk drive, etc.). Graphics processing unit memory 15 may include one or more of optically readable storage media (e.g., optical disks, etc.), magnetically readable storage media (e.g., magnetic tape, magnetic hard drive, floppy drive, etc.), electrical charge-based storage media (e.g., EPROM, EEPROM, RAM, etc.), solid-state storage media (e.g., flash drive, etc.), and/or other electronically readable storage media. Graphics processing unit memory 15 may be a separate component within system 10, or graphics processing unit memory 15 may be provided integrally with one or more other components of system 10 (e.g., graphics processing unit 14). Although graphics processing unit memory 15 is shown in FIG. 1 as a single entity, this is for illustrative purposes only. In some implementations, graphics processing unit memory 15 may comprise a plurality of storage units. These storage units may be physically located within the same device, or graphics processing unit memory 15 may represent storage functionality of a plurality of devices operating in coordination.

Figure 2:
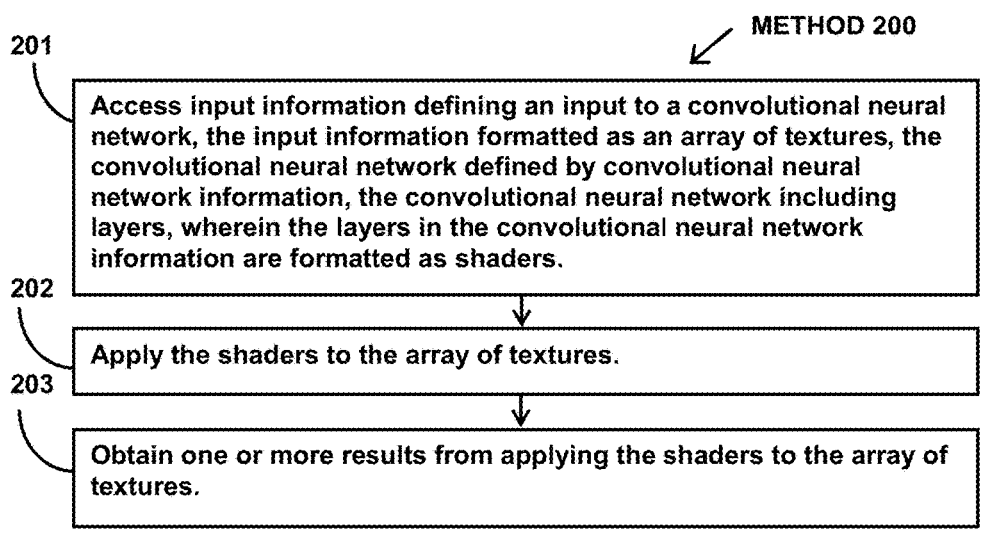
FIG. 2 illustrates a method for processing convolutional neural network operations using textures.

FIG. 2 illustrates method 200 for processing convolutional neural network operations using textures. The operations of method 200 presented below are intended to be illustrative. In some implementations, method 200 may be accomplished with one or more additional operations not described, and/or without one or more of the operations discussed. In some implementations, two or more of the operations may occur substantially simultaneously.

In some implementations, method 200 may be implemented in one or more processing devices (e.g., a digital processor, an analog processor, a digital circuit designed to process information, a central processing unit, a graphics processing unit, a microcontroller, an analog circuit designed to process information, a state machine, and/or other mechanisms for electronically processing information). The one or more processing devices may include one or more devices executing some or all of the operation of method 200 in response to instructions stored electronically on one or more electronic storage mediums. The one or more processing devices may include one or more devices configured through hardware, firmware, and/or software to be specifically designed for execution of one or more of the operation of method 200.

Referring to FIG. 2 and method 200, at operation 201, input information may be accessed. The input information may define an input to a convolutional neural network. The input information may be formatted as an array of textures. The textures may be characterized by a width, a height, and a number of channels. The convolutional neural network may be defined by convolutional neural network information. The convolutional neural network may include layers. The layers may define operations on the input to the convolutional neural network. The layers in the convolutional neural network may be formatted as shaders. In some implementation, operation 201 may be performed by a processor component the same as or similar to access component 102 (Shown in FIG. 1 and described herein).

At operation 202, the shaders may be applied to the array of textures. Applying the shaders to the array of textures may effectuate processing the input to the convolutional neural network through the layers of the convolutional neural network. In some implementations, operation 202 may be performed by a processor component the same as or similar to shader component 104 (Shown in FIG. 1 and described herein).

At operation 203, one or more results may be obtained from applying the shaders to the array of textures. In some implementations, operation 203 may be performed by a processor component the same as or similar to result component 106 (Shown in FIG. 1 and described herein).

Although the system(s) and/or method(s) of this disclosure have been described in detail for the purpose of illustration based on what is currently considered to be the most practical and preferred implementations, it is to be understood that such detail is solely for that purpose and that the disclosure is not limited to the disclosed implementations, but, on the contrary, is intended to cover modifications and equivalent arrangements that are within the spirit and scope of the appended claims. For example, it is to be understood that the present disclosure contemplates that, to the extent possible, one or more features of any implementation can be combined with one or more features of any other implementation.

What is claimed is:

1. A system for processing convolutional neural network operations using textures, the system comprising:

physical storage media storing convolutional neural network information, the convolutional neural network information defining a convolutional neural network, the convolutional neural network including layers, the layers defining operations on an input to the convolutional neural network, wherein the layers in the convolutional neural network information are formatted as shaders; and one or more physical processors configured by machine-readable instructions to:

access the input to the convolutional neural network;
format the input as an array of textures;
store the array of textures as input information;
access the input information, the input information defining the input to the convolutional neural network, the input information formatted as the array of textures, the textures characterized by a width, a height, and a number of channels;

apply the shaders to the array of textures, wherein applying the shaders to the array of textures effectuates processing the input to the convolutional neural network through the layers of the convolutional neural network; and obtain one or more results from applying the shaders to the array of textures.

2. The system of claim 1, wherein the one or more physical processors are further configured by machine-readable instructions to:

access layer information, the layer information defining one or more of the layers of the convolutional neural network;

format one or more of the operations defined by the one or more of the layers as one or more of the shaders; and add the shaders to the convolutional neural network information.

3. The system of claim 1, wherein the number of channels of the textures is four.

4. The system of claim 3, wherein individual shaders output information for four channels.

5. The system of claim 1, further comprising a graphics processing unit, wherein the shaders are applied to the array of textures by the graphics processing unit.

6. The system of claim 5, further comprising a graphics processing unit memory, wherein one or more inputs to the shaders and one or more outputs of the shaders are stored in the graphics processing unit memory.

7. The system of claim 5, wherein the graphics processing unit is included in a mobile device.

8. The system of claim 1, wherein the layers of the convolutional neural network include one or more convolution layers, the convolution layers processed using binary convolution.

9. The system of claim 1, wherein the array of textures are stored using an int32 structure, the int32 structure including four int8 structures, an individual int8 structure storing a four by two patch of a single channel of an individual texture.

10. A method for processing convolutional neural network operations using textures, the method comprising:

accessing the input to a convolutional neural network;
formatting the input as an array of textures;
storing the array of textures as input information
accessing the input information, the input information defining the input to the convolutional neural network, the convolutional neural network defined by convolutional neural network information, the convolutional neural network including layers, the layers defining operations on the input to the convolutional neural network, wherein the layers in the convolutional neural network information are formatted as shaders and the input information is formatted as the array of textures, the textures characterized by a width, a height, and a number of channels;

applying the shaders to the array of textures, wherein applying the shaders to the array of textures effectuates processing the input to the convolutional neural network through the layers of the convolutional neural network; and obtaining one or more results from applying the shaders to the array of textures.

11. The method of claim 10, further comprising:

accessing layer information, the layer information defining one or more of the layers of the convolutional neural network;

formatting one or more of the operations defined by the one or more of the layers as one or more of the shaders; and adding the shaders to the convolutional neural network information.

12. The method of claim 10, wherein the number of channels of the textures is four.

13. The method of claim 12, wherein individual shaders output information for four channels.

14. The method of claim 10, wherein the shaders are applied to the array of textures by a graphics processing unit.

15. The method of claim 14, wherein one or more inputs to the shaders and one or more outputs of the shaders are stored in a graphics processing unit memory.

16. The method of claim 14, wherein the graphics processing unit is included in a mobile device.

17. The method of claim 10, wherein the layers of the convolutional neural network include one or more convolution layers, the convolution layers processed using binary convolution.

18. The method of claim 10, wherein the array of textures are stored using an int32 structure, the int32 structure including four int8 structures, an individual int8 structure storing a four by two patch of a single channel of an individual texture.

* * * * *